(12) United States Patent
Nakagawa et al.

(10) Patent No.: US 6,316,939 B1
(45) Date of Patent: Nov. 13, 2001

(54) MAGNETIC SENSOR MEASURING APPARATUS AND CURRENT SENSOR NON-CONTACT MEASURING APPARATUS

(75) Inventors: Shiro Nakagawa; Katsumi Yabusaki, both of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/648,460

(22) Filed: Aug. 28, 2000

Related U.S. Application Data

(63) Continuation of application No. PCT/JP00/03134, filed on May 16, 2000.

(30) Foreign Application Priority Data

Sep. 10, 1999 (JP) .................................. 11-256838
Sep. 10, 1999 (JP) .................................. 11-256839

(51) Int. Cl.⁷ .................................. G01R 33/04
(52) U.S. Cl. .................. 324/253; 324/225; 324/117 R
(58) Field of Search .................. 324/225, 253, 324/96, 117 H, 117 R, 127; 327/108, 110, 190, 191; 33/361

(56) References Cited

U.S. PATENT DOCUMENTS

| 4,384,254 | 5/1983 | Brown | 324/253 |
|---|---|---|---|
| 4,503,395 | 3/1985 | Kratzer et al. | 324/253 |
| 4,626,782 | 12/1986 | Lewis | 324/253 |
| 5,287,059 | 2/1994 | Ando et al. | 324/253 |
| 5,537,038 * | 7/1996 | Ando | 324/253 |

FOREIGN PATENT DOCUMENTS

| 0-155324 | 1/1993 | (EP) . |
|---|---|---|
| 56-60370 | 5/1981 | (JP) . |
| 57-194424 | 11/1982 | (JP) . |
| 57-199968 | 12/1982 | (JP) . |
| 60-57277 | 4/1985 | (JP) . |
| 2-23407 | 1/1990 | (JP) . |
| 4-24574 | 1/1992 | (JP) . |
| 5-281312 | 10/1993 | (JP) . |
| 9-61506 | 3/1997 | (JP) . |

* cited by examiner

Primary Examiner—Jay Patidar
(74) Attorney, Agent, or Firm—Oliff & Berridge, PLC

(57) ABSTRACT

It is an object of the invention to provide a magnetic sensor apparatus and a current sensor apparatus each of which incorporates a fluxgate element for reducing an offset voltage and reducing variations in offset voltage. A drive section for exciting a sensor coil (2) includes a self-excited oscillation circuit having a resonant circuit part of which is made up of the sensor coil (2). The self-excited oscillation circuit includes an npn transistor (21) and a pnp transistor (31) that are amplifier elements used for continuing oscillation. The npn transistor (21) operates when an oscillation wave is on the positive side. The pnp transistor (31) operates when an oscillation wave is on the negative side. In the self-excited oscillation circuit, clamping of oscillation waves similarly occurs on both positive and negative sides. Therefore, the oscillation waveform has symmetrical positive and negative portions or has minor asymmetry if any.

20 Claims, 11 Drawing Sheets

MAGNETIC SENSOR MEASURING APPARATUS AND CURRENT SENSOR NON-CONTACT MEASURING APPARATUS

This is a Continuation of application No. PCT/JP00/03134 filed May 16, 2000. The entire disclosure of the prior application(s) is hereby incorporated by reference herein in its entirety.

TECHNICAL FIELD

The present invention relates to a magnetic sensor apparatus for measuring a relatively large magnetic field and an electric current sensor apparatus used for non-contact measurement of a large current through the use of the magnetic sensor apparatus.

BACKGROUND ART

With concern about the environment, considerable developments have been recently made in electric automobiles and solar-electric power generation that produce less environmental pollution. A direct current of several kilowatts to tens of kilowatts is dealt with in an electric car or solar-electric power generation. Therefore, a non-contact current sensor apparatus is required for measuring a direct current of tens to hundreds of amperes. Since the demand for such current sensor apparatuses is extremely great, it is requested in society to provide current sensor apparatuses that are inexpensive and exhibit high accuracy.

A current sensor apparatus incorporating a Hall element as a magnetic sensor is widely used for non-contact measurement of an electric current through measuring a magnetic field generated by the current with the magnetic sensor.

However, the Hall element has a problem of offset voltage that requires troublesome handling, which prevents a reduction in the price of the current sensor apparatus. The offset voltage means a residual output voltage when the magnetic field to be measured is zero.

There is a magnetic sensor apparatus or a current sensor apparatus that incorporates a fluxgate element as a magnetic sensor that utilizes saturation of a magnetic core. Attention has been given to such an apparatus that is expected to produce no offset voltage, according to the principle.

Reference is now made to FIG. 12 to describe the operation principle of a fluxgate element having the simplest configuration. FIG. 12 is a plot for showing the relationship between an inductance of a coil wound around a magnetic core and a coil current. Since the core has a magnetic saturation property, the effective permeability of the core is reduced and the inductance of the coil is reduced if the coil current increases. Therefore, if bias magnetic field B is applied to the core by a magnet and the like, the magnitude of external magnetic field $H_0$ is measured as a change in inductance of the coil when external field $H_0$ is superposed on the bias field. This is the operation principle of the simplest fluxgate element. In FIG. 12 each of bias field B and external field $H_0$ is expressed in the magnitude converted to the coil current.

In this method the position of bias point B changes with factors such as the intensity of the magnetic field generated by the magnet or the positions of the magnet and the core in relation to each other. It is therefore required to maintain the inductance at a specific value when the external magnetic field is zero. However, it is extremely difficult to compensate for the instability of the inductance value due to temperature changes and other external perturbations. This method is therefore not suitable for practical applications.

If a rod-shaped magnetic core is used, an open magnetic circuit is provided, so that the effect of hysteresis is generally very small. Assuming that the hysteresis of the core is negligible, the characteristic of variations in inductance is equal when the coil current flows in the positive direction and in the negative direction since the saturation characteristic of the core is independent of the direction of coil current. For example, it is assumed that point $P_+$ and point $P_-$ of FIG. 12 represent the coil current in the positive direction and the coil current of the negative direction, respectively, whose absolute values are equal to each other. In the neighborhood of each of these points, the characteristic of variations in inductance with respect to variations in the absolute value of the coil current is equal. Therefore, an alternating current may be applied to the coil such that the core is driven into a saturation region at a peak, and the difference in the amounts of decreases in the inductance may be measured when positive and negative peak values of the current are obtained. As a result, the difference thus measured is constantly zero when the external magnetic field is zero, which is always the case even when the characteristics of the core change due to temperature changes or external perturbations. That is, no offset voltage is generated in this case. In the present patent application a saturation region of the magnetic core means a region where an absolute value of the magnetic field is greater than the absolute value of the magnetic field when the permeability of the core is maximum.

An external magnetic field is assumed to be applied to the core. If external field $H_0$ is applied in the positive direction of the current, as shown in FIG. 12, for example, the inductance value decreases at the positive peak of the current (point $Q_+$ in FIG. 12, for example) and the inductance value increases at the negative peak of the current (point $Q_-$ in FIG. 12, for example). Therefore, the difference between these values is other than zero. Since the difference in the inductance values depends on the external magnetic field, the external field is obtained by measuring the difference in the inductance values.

With regard to a magnetic sensor apparatus or a current sensor apparatus incorporating a fluxgate element, the difference of the inductance values described above may be obtained from a signal obtained through differentiating the voltage generated across another inductance element connected in series to the sensor coil, that is, a signal equivalent to the second-order differential coefficient of the current flowing through the sensor coil.

The method thus described is called a large amplitude excitation method in the present patent application, that is, to apply an alternating current to the sensor coil such that the core is driven into a saturation region at a peak, and to measure the difference in the amounts of decreases in inductance at positive and negative peak values of the current.

In Published Unexamined Japanese Patent Application Hei 4-24574 (1992), an oscillation circuit including a resonant circuit part of which is made up of a sensor coil is disclosed. The oscillation circuit is provided as a means for applying an alternating current to the sensor coil.

When an external magnetic field is zero, it is required that the excitation current of the sensor coil has a wave with symmetrical positive and negative portions in order that the difference between the inductance values of the sensor coil at the positive and negative peaks of the current is zero.

However, the positive and negative portions of the waveform of the excitation current are not symmetrical, strictly speaking, if a drive circuit for exciting the sensor coil is actually fabricated and its operation is studied in detail. If a self-excited oscillation circuit is used as the drive circuit, in particular, asymmetry between the positive and negative portions of the wave of the excitation current is considerably great. Therefore, an offset voltage that is not negligible is generated in practice by a sensor apparatus utilizing the large amplitude excitation method, too.

The problems resulting from the offset voltage are that: the offset voltage causes a constant error in the output of the sensor apparatus; and that the offset voltage varies due to external perturbations such as a temperature and supply voltage.

It is known through observation that it is energy loss in the control input of an active element making up the oscillation circuit that induces the asymmetry between the positive and negative portions of the wave of the excitation current. It is also known that the major one of the external perturbations that cause variations in the asymmetry mentioned above is variations in the operating temperature of the active element making up the oscillation circuit.

Reference is now made to FIG. 13 to FIG. 15 to describe in detail the asymmetry between the positive and negative portions of the wave of the excitation current mentioned above.

FIG. 13 is a block diagram illustrating an example of the configuration of a magnetic sensor apparatus incorporating a fluxgate element. This magnetic sensor apparatus comprises: a magnetic core 201; a sensor coil 202 made up of at least one coil wound around the core 201; an alternating current supply section 203 for supplying an alternating drive current to the sensor coil 202 such that the core 201 is driven into a saturation region, an end of the section 203 being connected to an end of the sensor coil 202, the other end of the section 203 being grounded; and an inductance element 204 for detecting variations in the inductance value of the sensor coil 202, the element 204 being connected to the sensor coil 202 in series. The inductance element 204 has an end connected to the other end of the sensor coil 202 and the other end grounded.

The magnetic sensor apparatus shown in FIG. 13 further comprises: a differentiation circuit 205 for differentiating the voltage generated across the inductance element 204, the circuit 205 being connected to the node between the sensor coil 202 and the inductance element 204; a positive peak hold circuit 206 for holding a positive peak value of an output signal of the differentiation circuit 205; a negative peak hold circuit 207 for holding a negative peak value of the output signal of the differentiation circuit 205; an adding circuit 208 for adding the value held at the positive peak hold circuit 206 to the value held at the negative peak hold circuit 207; and an output terminal 209 from which an output signal of the adding circuit 208 is outputted.

In the magnetic sensor apparatus shown in FIG. 13, the alternating current supply section 203 supplies an excitation current of the sensor coil 202. This excitation current is differentiated twice at the inductance element 204 and the differentiation circuit 205, and made into a spike-shaped voltage signal that contains voltage values having opposite polarities and indicates positive and negative peak values of the excitation current. Each of these peak values of the positive and negative spike-shaped voltage values of this signal is held at the positive peak hold circuit 206 and the negative peak hold circuit 207, respectively, and added to each other at the adding circuit 208. The result is then outputted from the terminal 209 as an output signal.

In the magnetic sensor apparatus shown in FIG. 13, the output signal is zero and no offset voltage is generated if the positive and negative portions of the wave of the excitation current of the sensor coil 202 are symmetrical, and the external magnetic field applied to the sensor coil 202 is zero.

However, as described above, the positive and negative portions of the wave of the excitation current are not symmetrical, strictly speaking, if a drive circuit is actually fabricated and studied in detail. If a self-excited oscillation circuit is used as the drive circuit, in particular, asymmetry between the positive and negative portions of the wave of the excitation current is considerably great. Therefore, an offset voltage that is not negligible is generated.

Reference is now made to FIG. 14 to describe the cause of asymmetry between positive and negative portions of the wave of the excitation current when a self-excited oscillation circuit is used. The following is description of an example wherein a Clapp oscillation circuit incorporating a bipolar transistor as an active element is used as the self-excited oscillation circuit. FIG. 14 is a circuit diagram illustrating an example of the configuration of the Clapp oscillation circuit for exciting the sensor coil 202.

The Clapp oscillation circuit shown in FIG. 14 comprises: an npn bipolar transistor 211; the sensor coil 202 that also functions as a resonant coil; and a capacitor 212 for resonance connected in series to the sensor coil 202. The sensor coil 202 and the capacitor 212 make up a series resonant circuit. The base of the transistor 211 is connected to an end of the sensor coil 202 through the capacitor 212. The other end of the sensor coil 202 is grounded. An end of a feedback capacitor 213 is connected to the base of the transistor 211. An end of a feedback capacitor 214 and the emitter of the transistor 211 are connected to the other end of the feedback capacitor 213. The other end of the capacitor 214 is grounded. The emitter of the transistor 211 is grounded through an emitter load coil 215. The collector of the transistor 211 is connected to a power input 216 and to the base through a bias resistor 217.

Consideration will now be given to an oscillation wave observed at the base of the transistor 211 in the oscillation circuit shown in FIG. 14. A base current is supplied to the transistor 211 in the neighborhood of the positive peak value of the oscillation wave. The transistor 211 then turns on and the capacitor 214 is charged by the emitter current. The energy produced through this charging is used for continuation of oscillation. It is noted that the base current of the transistor 211 does not flow in the neighborhood of the negative peak value of the oscillation wave, but only flows in the neighborhood of the positive peak value. As a result, part of the resonant energy is consumed as a base current only in the neighborhood of the positive peak value of the oscillation wave. In addition, if the transistor 211 is saturated, the combination of the base and the emitter is simply an equivalent of a diode. Therefore, the oscillation wave observed at the base of the transistor 211 has a shape in which a portion near a positive peak value is clamped, as shown in FIG. 15. In this way, asymmetry of the oscillation wave between positive and negative portions is created, that is, asymmetry of the wave of the excitation current between positive and negative portions is created. In FIG. 15 $V_{CL}$ indicates a clamping potential.

If value Q of the resonant circuit is sufficiently great, the asymmetry of the oscillation wave is corrected by the resonant circuit. However, value Q of the sensor coil 102 is not very great with regard to the magnetic sensor incorporating the fluxgate element. Therefore, the asymmetry mentioned above remains, which causes generation of an offset voltage.

Moreover, in the oscillation circuit shown in FIG. 14, the forward stopping potential between the base and emitter of the transistor 211 decreases as the operating temperature of the transistor 211 rises. The clamping potential thereby decreases. That is, the asymmetry mentioned above becomes greater as the operating temperature of the transistor 211 increases, and the offset voltage increases.

In the oscillation circuit shown in FIG. 14 the oscillation amplitude increases as the operating temperature of the transistor 211 rises, which promotes an increase in the offset voltage. This fact will be described as follows.

Since the excitation current supplied from the oscillation circuit contains no direct current components, the area of the positive portion and the area of the negative portion of the excitation current waveform are equal. If the excitation current waveform has asymmetrical positive and negative portions, the amount of an increase in amplitude in the positive portion is not equal to the amount of an increase in amplitude in the negative portion when the amplitude of the entire wave is increased.

For example, a case is assumed for convenience, in which the positive portion of the excitation current waveform is a trapezoid, the negative portion is a triangle, and each of the trapezoid and the triangle has a base equal in length. If the amplitude of the entire wave of the excitation current is increased, the amount of an increase in amplitude is greater in the negative portion than in the positive portion since the area of the positive portion is equal to that of the negative portion. In such a manner, with regard to the oscillation circuit shown in FIG. 14, the oscillation amplitude increases as the operating temperature of the transistor 211 rises. As a result, the asymmetry of the excitation current wave with respect to the positive and negative portions becomes greater and the offset voltage increases.

In order to solve the foregoing problems, with regard to the example of the oscillation circuit shown in FIG. 14, it is required to: minimize the energy consumed as a base current in the neighborhood of a positive peak value of the oscillation wave; reduce clamping between the base and the emitter; and eliminate variations in the clamping potential due to a temperature and variations in the oscillation amplitude due to a temperature.

The foregoing problems will not be solved only by adopting a Darlington transistor, a junction field-effect transistor (a field-effect transistor may be called a FET in the following description), or a metal-oxide semiconductor (MOS) FET. The reason will now be described.

In an actual experiment, it is possible to reduce energy consumed as a base current when a Darlington transistor is utilized. However, the equivalent current amplification factor is extremely increased. Operation instability due to the dependence of collector current leakage on a temperature is thus increased. Adopting the Darlington transistor is therefore not practical. If a junction FET is adopted, clamping of the oscillation wave is impossible since the FET is voltage-controlled. However, there is no type of junction FET that has a large current-carrying capacity. If the junction FET is incorporated in an excitation circuit that requires a large excitation current, power loss due to the internal resistance of the junction FET is so great that it is not suitable for practical applications. If a MOS FET is utilized, the MOS FET has a drawback similar to that of the junction FET if the MOS FET is an element having a high on-state resistance. If the MOS FET has a low on-state resistance, distortion of the oscillation wave due to the gate-source capacitance is great. The drawback thereof is therefore greater than that of a bipolar transistor.

As described so far, the following three points are important for solving the problems of offset voltage of the magnetic sensor apparatus or current sensor apparatus incorporating a fluxgate element.

(1) To minimize asymmetry of the oscillation wave between positive and negative portions.

(2) To prevent variations in asymmetry of the oscillation wave with respect to positive and negative portions, due to the operating temperature of an active element of the oscillation circuit.

(3) To prevent variations in oscillation amplitude, due to the operating temperature of an active element of the oscillation circuit.

Point (1) reduces the absolute value of the offset voltage. Point (2) eliminates variations in offset voltage due to temperature changes. Point (3) prevents an increase in offset voltage due to temperature changes.

DISCLOSURE OF THE INVENTION

It is a first object of the invention to provide a magnetic sensor apparatus and a current sensor apparatus each incorporating a fluxgate element for reducing variations in offset voltage.

In addition to the above-stated first object, it is a second object of the invention to provide a magnetic sensor apparatus and a current sensor apparatus that decrease the offset voltage.

A magnetic sensor apparatus of the invention comprises: a magnetic core; a sensor coil wound around the core and provided for detecting an applied magnetic field to be measured; and a drive means for driving the sensor coil by supplying an alternating current to the sensor coil; the alternating current driving the core into a saturation region. The drive means incorporates a self-excited oscillation circuit including a resonant circuit part of which is made up of the sensor coil. The self-excited oscillation circuit includes two active elements each of which individually causes variations in an oscillation wave in response to changes in operating temperature, and the variations in the oscillation wave caused by the two active elements work in directions that suppress variations in asymmetry of the oscillation wave between positive and negative portions of the wave.

A current sensor apparatus of the invention is provided for measuring an electric current by measuring a magnetic field generated by the current to be measured. The apparatus comprises: a magnetic core; a sensor coil wound around the core and provided for detecting an applied magnetic field to be measured; and a drive means for driving the sensor coil by supplying an alternating current to the sensor coil; the alternating current driving the core into a saturation region. The drive means incorporates a self-excited oscillation circuit including a resonant circuit part of which is made up of the sensor coil. The self-excited oscillation circuit includes two active elements each of which individually causes variations in an oscillation wave in response to changes in operating temperature, and the variations in the oscillation wave caused by the two active elements work in directions that suppress variations in asymmetry of the oscillation wave between positive and negative portions of the wave.

In the magnetic sensor apparatus or the current sensor apparatus of the invention, each of the two active elements individually causes variations in the oscillation wave in response to changes in operating temperature. The variations in the oscillation wave caused by the two active elements work in directions that suppress variations in asymmetry of the oscillation wave between positive and negative portions of the wave.

According to the magnetic sensor apparatus or the current sensor apparatus of the invention, the two active elements may be: an npn transistor that operates when the oscillation wave is on the positive side; and a pnp transistor that operates when the oscillation wave is on the negative side. Those npn and pnp transistors are amplifier elements used for continuing oscillation. In this case, with regard to the self-excited oscillation circuit, clamping of the oscillation wave similarly occurs on the positive and negative sides. As a result, the asymmetry of the oscillation wave between positive and negative portions is reduced.

According to the magnetic sensor apparatus or the current sensor apparatus of the invention, the emitter of the npn transistor may be connected to the emitter of the pnp transistor.

According to the magnetic sensor apparatus or the current sensor apparatus of the invention, it is preferred that the npn transistor and the pnp transistor are formed on one semiconductor substrate.

The magnetic sensor apparatus or the current sensor apparatus of the invention may further comprise: a detection means for detecting the alternating current flowing through the sensor coil; and a control means for controlling the drive means based on a result of detection of the detection means and controlling an amplitude of the current flowing through the sensor coil. In this case, the control means may control an operating voltage of the drive means in an equivalent manner.

According to the magnetic sensor apparatus or the current sensor apparatus of the invention, the two active elements may be: a first active element having a property of decreasing an oscillation amplitude as the operating temperature rises; and a second active element having a property of increasing the oscillation amplitude as the operating temperature rises. In this case, variations in the offset voltage in response to temperature changes are suppressed.

According to the magnetic sensor apparatus or the current sensor apparatus of the invention, the first active element may be a field-effect transistor and the second active element may be a bipolar transistor.

In the magnetic sensor apparatus or the current sensor apparatus of the invention, the field-effect transistor and the bipolar transistor may be connected to each other in a concatenation manner.

According to the magnetic sensor apparatus or the current sensor apparatus of the invention, the self-excited oscillation circuit may include: a voltage-current transducer incorporating the field-effect transistor and converting a voltage having a wave corresponding to the oscillation wave into a current and outputting the current; and a current amplifier element incorporating the bipolar transistor and amplifying the current outputted from the transducer and generating a current used for continuing oscillation. In this case, no clamping occurs. Therefore, the asymmetry of the oscillation wave between positive and negative portions is suppressed, and the offset voltage is reduced.

According to the magnetic sensor apparatus or the current sensor apparatus of the invention, the self-excited oscillation circuit may be a Colpitts oscillation circuit or a Clapp oscillation circuit.

Other and further objects, features and advantages of the invention will appear more fully from the following description.

BEST MODES FOR CARRYING OUT THE INVENTION

Embodiments of the invention will now be described in detail with reference to the accompanying drawings.

[First Embodiment]

Figure 1:
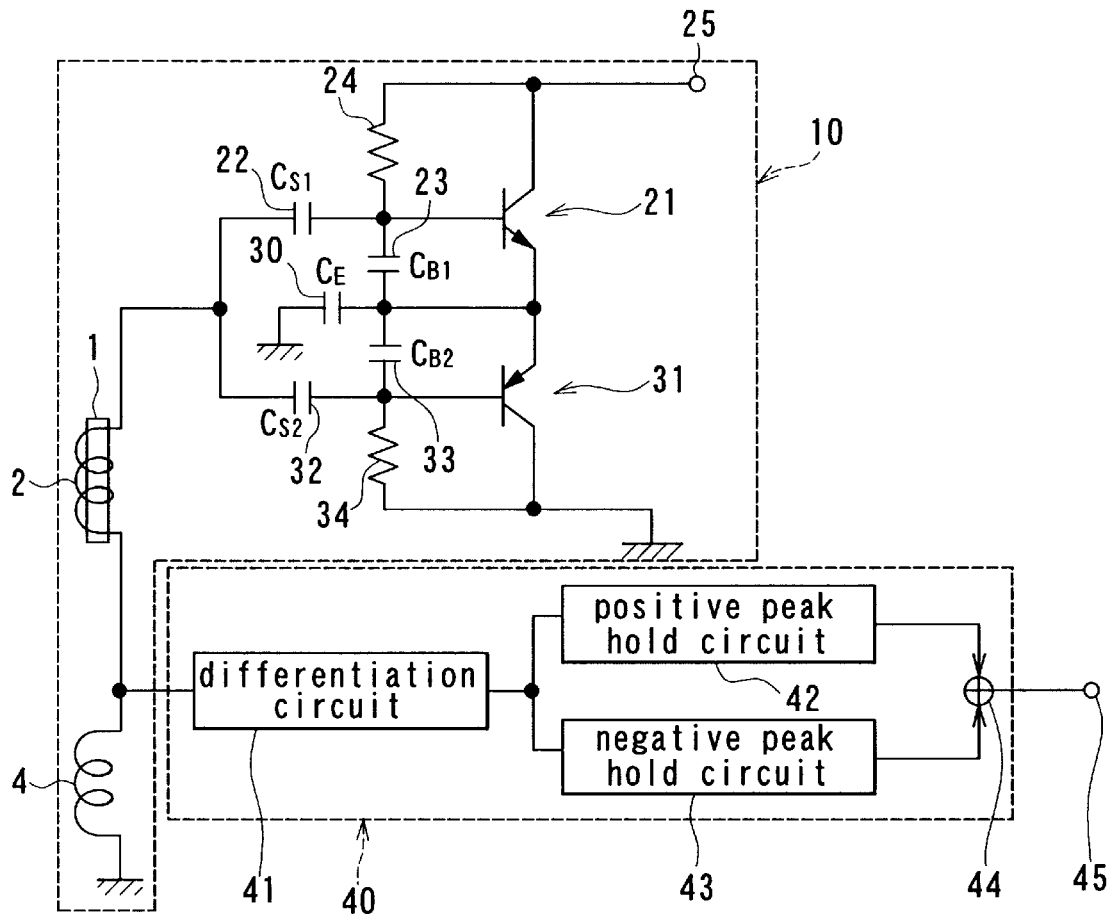
FIG. 1 is a circuit diagram illustrating the configuration of a magnetic sensor apparatus of a first embodiment of the invention.

FIG. 1 is a circuit diagram illustrating the configuration of a magnetic sensor apparatus of a first embodiment of the invention. The magnetic sensor apparatus comprises: a magnetic core 1 having a magnetic saturation property: a sensor coil 2 made up of at least one coil wound around the core 1; a drive section 10 for supplying an alternating current to the sensor coil 2 such that the core 1 is driven into a saturation region, and driving the sensor coil 2; an inductance element 4 connected to the sensor coil 2 in series; and a detection section 40 for measuring a magnetic field. The sensor coil 2 is a coil for detecting an applied magnetic field to be measured. The inductance element 4 is an element for detecting variations in the inductance value of the sensor coil 2. The inductance element 4 may be a coil having an end connected to the other end of the sensor coil 2 and the other end grounded. The drive section 10 includes the sensor coil 2 and the inductance element 4. The detection section 40 is connected to the node between the sensor coil 2 and the inductance element 4.

The drive section 10 is a self-excited oscillation circuit having the following configuration. The self-excited oscillation circuit incorporates an npn transistor 21 and a pnp transistor 31 as amplifier elements used for continuing oscillation. The npn transistor 21 operates when the oscillation wave is on the positive side. The pnp transistor 31 operates when the oscillation wave is on the negative side. It is preferred that the npn transistor 21 and the pnp transistor 31 are formed on one semiconductor substrate (wafer).

The base of the npn transistor 21 is connected to an end of a capacitor 22 for resonance. The base of the pnp transistor 31 is connected to an end of a capacitor 32 for resonance. The other end of each of the capacitors 22 and 32 is connected to an end of the sensor coil 2.

The base of the npn transistor 21 is connected to an end of a feedback capacitor 23. The base of the pnp transistor 31 is connected to an end of a feedback capacitor 33. The other end of each of the capacitors 23 and 33 is connected to an end of a feedback capacitor 30. The other end of the capacitor 30 is grounded.

The emitter of the npn transistor 21 and the emitter of the pnp transistor 31 are connected to each other and connected to the node between the capacitors 23 and 33.

The base of the npn transistor 21 is connected to a power input 25 through a bias resistor 24. The collector of the npn transistor 21 is connected to the power input 25.

The base of the pnp transistor 31 is grounded through a bias resistor 34. The collector of the pnp transistor 31 is grounded.

In the drive section 10 having such a configuration, a series resonant circuit of the self-excited oscillation circuit is made up of the sensor coil 2, the inductance element 4 and the capacitors 22, 23, 30, 32 and 33. That is, part of the series resonant circuit is made up of the sensor coil 2.

Assuming that the capacitance values of the capacitors 22, 23, 30, 32 and 33 of FIG. 1 are $C_{S1}$, $C_{B1}$, $C_E$, $C_{S2}$ and $C_{B2}$, respectively, the self-excited oscillation circuit shown in FIG. 1 is a Clapp oscillation circuit, wherein $C_{S1}$ or $C_{S2} << C_{B1}$ or $C_{B2}$, and $C_{S1}$ or $C_{S2} << C_E$. The self-excited oscillation circuit of FIG. 1 is a Colpitts oscillation circuit, wherein $C_{S1}$ or $C_{S2} >> C_{B1}$ or $C_{B2}$, and $C_{S1}$ or $C_{S2} >> C_E$.

The detection section 40 comprises: a differentiation circuit 41 for differentiating the voltage generated across the inductance element 4, the circuit 41 being connected to the node between the sensor coil 2 and the inductance element 4; a positive peak hold circuit 42 for holding a positive peak value of an output signal of the differentiation circuit 41; a negative peak hold circuit 43 for holding a negative peak value of the output signal of the differentiation circuit 41; and an adding circuit 44 for adding the value held at the positive peak hold circuit 42 to the value held at the negative peak hold circuit 43. An output of the adding circuit 44 is connected to an output terminal 45

The operation of the magnetic sensor apparatus of this embodiment will now be described. In the magnetic sensor apparatus, the drive section 10 made up of the self-excited oscillation circuit supplies an alternating excitation current to the sensor coil 2. This excitation current is such a current that the core 1 is driven into a saturation region. The sensor coil 2 is thereby driven. This excitation current is equal to the current value limited by the supply voltage multiplied by value Q of the series resonant circuit of the self-excited oscillation circuit.

When the core 1 is driven into the saturation region in a neighborhood of a peak value of the excitation current, the inductance value of the sensor coil zabruptly decreases, so that the excitation current abruptly increases. If the wave of the excitation current is differentiated twice, it is possible to detect an output of an opposite phase that is geometrically similar to the wave of the current that has abruptly increased. In this embodiment the excitation current of the sensor coil 2 is differentiated twice at the inductance element 4 and the differentiation circuit 41, and made into a spike-shaped voltage signal that contains voltage values having opposite polarities and indicates positive and negative peak values of the excitation current. Each of these peak values of the positive and negative spike-shaped voltage values of this signal is held at the positive peak hold circuit 42 and the negative peak hold circuit 43, respectively, and added to each other at the adding circuit 44. The result is then outputted from the terminal 45 as an output signal corresponding to the magnetic field to be measured.

In the self-excited oscillation circuit of this embodiment, the npn transistor 21 turns on near the positive peak value of the wave of the oscillation voltage applied to the base. The capacitor 30 is then charged by the emitter current. The energy charged in the capacitor 30 is used for continuation of oscillation. Part of the resonant energy is consumed as a base current of the transistor 21 in the neighborhood of the positive peak value of the oscillation wave. At the same time, clamping occurs.

On the other hand, the pnp transistor 31 turns on near the negative peak value of the wave of the oscillation voltage applied to the base. The emitter current makes the capacitor 30 discharge, that is, the capacitor 30 is charged in the direction opposite to the direction of the positive peak of the oscillation voltage wave. The energy charged in the capacitor 30 is used for continuation of oscillation. Part of the resonant energy is consumed as a base current of the transistor 31 in the neighborhood of the negative peak value of the oscillation wave. At the same time, clamping occurs.

Figure 2:
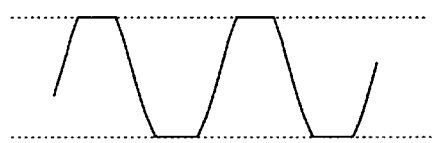
FIG. 2 is a plot for illustrating the oscillation waveform of the magnetic sensor apparatus of the first embodiment.

In such a manner, clamping of the oscillation wave similarly occurs on the positive and negative sides. Therefore, according to the embodiment, the oscillation wave is symmetrical with respect to the positive and negative portions, as shown in FIG. 2, or has minor asymmetry if any. As a result, it is possible to reduce the offset voltage of the magnetic sensor apparatus incorporating the fluxgate element, according to the embodiment.

According to the embodiment, even if the clamping potential changes in accordance with variations in the operating temperature of the transistors 21 and 31, variations in the clamping potential similarly occur on the positive and negative sides of the oscillation wave. The symmetry of the oscillation wave between the positive and negative portions is therefore maintained. As a result, according to the embodiment, it is possible to reduce temperature-induced variations in the offset voltage of the magnetic sensor apparatus incorporating the fluxgate element.

According to the embodiment, the emitter of the npn transistor 21 is connected to the emitter of the pnp transistor 31. Therefore, one of the transistors functions as the load of the emitter of the other of the transistors. It is not necessary to provide individual loads for the emitters of the transistors 21 and 31.

If the npn transistor 21 and the pnp transistor 31 are formed on one semiconductor substrate in this embodiment, the properties of the transistors 21 and 31 with respect to temperature changes are more similar to each other, compared to the case where the transistors 21 and 31 are separated. It is thus possible to more greatly reduce variations in the offset voltage with respect to temperature changes.

Figure 3:
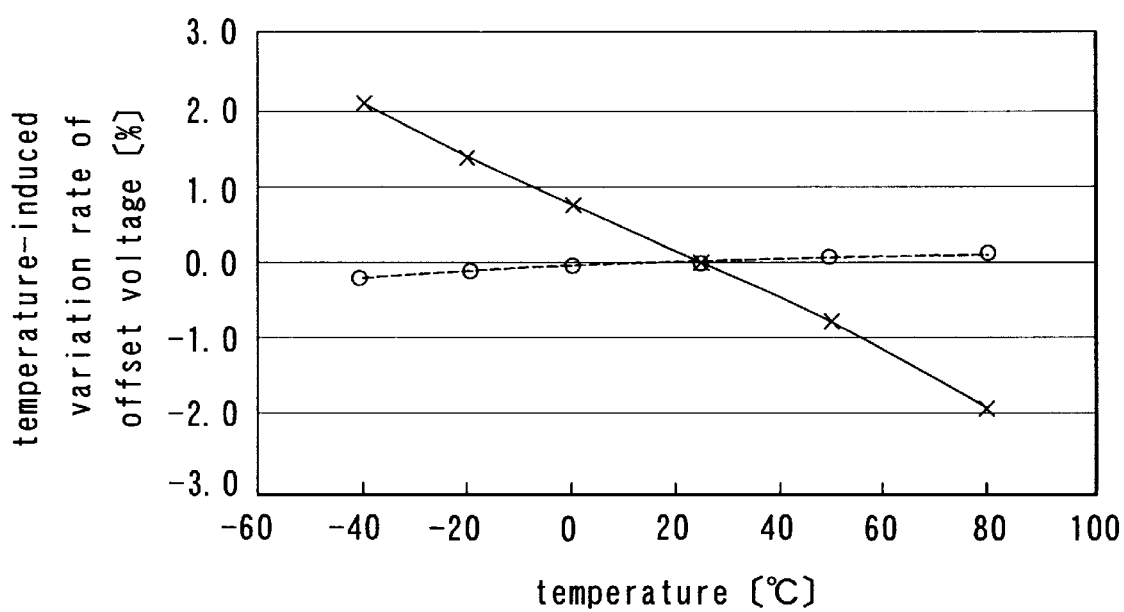
FIG. 3 is a plot for illustrating an example of a temperature-induced variation rate of the offset voltage of the magnetic sensor apparatus of the first embodiment.

FIG. 3 is a plot for illustrating an example of the temperature-induced variation rate of the offset voltage of the magnetic sensor apparatus of this embodiment. In FIG.

3 the horizontal axis indicates temperatures while the vertical axis indicates temperature-induced variation rates of the offset voltage. The temperature-induced variation rates of the offset voltage indicate variation rates of the output voltage at different temperatures each of which is expressed as a percentage, referred to the output voltage of the magnetic sensor apparatus obtained at 25° C. In FIG. 3 the broken line indicates the property of the magnetic sensor apparatus of the embodiment. The solid line indicates the property of the magnetic sensor apparatus incorporating the oscillation circuit shown in FIG. 14, for example, as an example for comparison.

The values of the temperature-induced variation rates of the offset voltage shown in FIG. 3 are as follows.

When the temperature is −40° C., the rate of the embodiment is −0.17% while the rate of the example for comparison is 2.08%.

When the temperature is −20° C., the rate of the embodiment is −0.13% while the rate of the example for comparison is 1.39%.

When the temperature is 0° C., the rate of the embodiment is −0.05% while the rate of the example for comparison is 0.75%.

When the temperature is 50° C., the rate of the embodiment is 0.06% while the rate of the example for comparison is −0.75%.

When the temperature is 80° C., the rate of the embodiment is 0.12% while the rate of the example for comparison is −1.87%.

As shown in FIG. 3, it is noted that the embodiment allows reductions in variations in the offset voltage in response to temperature changes.

[Second Embodiment]

Figure 4:
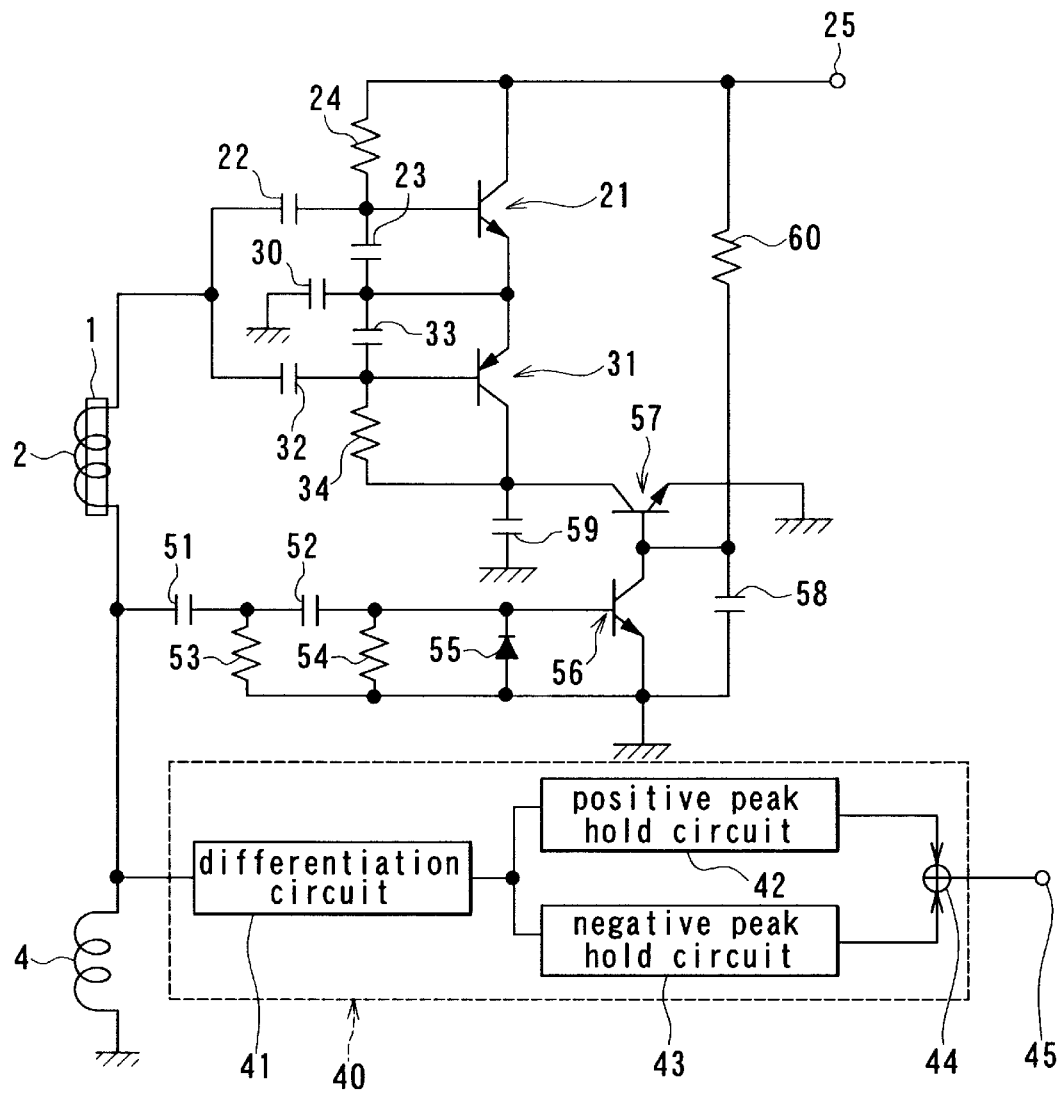
FIG. 4 is a circuit diagram illustrating the configuration of a magnetic sensor apparatus of a second embodiment of the invention.

Reference is now made to FIG. 4 to describe a magnetic sensor apparatus of a second embodiment of the invention. FIG. 4 is a circuit diagram illustrating the configuration of the magnetic sensor apparatus of the second embodiment.

The magnetic sensor apparatus of the second embodiment is similar to the magnetic sensor apparatus of the first embodiment to which a detection means and a control means are added. The detection means detects an alternating current flowing through the sensor coil 2. The control means controls the drive section based on the result of detection of the detection means and controls the amplitude of the current flowing through the sensor coil 2.

The detection means and the control means mentioned above have the following configurations. An end of the capacitor 51 is connected to the node between the sensor coil 2 and the inductance element 4. An end of a capacitor 52 and an end of a resistor 53 are connected to the other end of the capacitor 51. An end of a resistor 54, the cathode of a diode 55 and the base of an npn transistor 56 are connected to the other end of the capacitor 52. The other end of each of the resistors 53 and 54, the anode of the diode 55 and the emitter of the transistor 56 are grounded. The collector of the transistor 56 is connected to the emitter thereof through a capacitor 58. The base of an npn transistor 57 is connected to the collector of the transistor 56.

In this embodiment the node between the collector of the transistor 31 and the resistor 34 is not grounded. This node is connected to the collector of the transistor 57 and grounded through a capacitor 59. The emitter of the transistor 57 is grounded. The collector of the transistor 56 and the base of the transistor 57 are connected to the power input 25, through a resistor 60.

The capacitor 51 and the resistor 53 make up a differentiation circuit. The capacitor 52, the resistor 54, the diode 55, the transistor 56 and the capacitor 58 make up a peak rectifier circuit that also functions as an amplifier circuit. Those differentiation circuit and the peak rectifier circuit correspond to a detection means of the invention. The transistor 57 controls the operation voltage of the drive section in an equivalent manner, and corresponds to a control means of the invention.

In this embodiment the voltage generated across the inductance element 4 is differentiated at the differentiation circuit made up of the capacitor 51 and the resistor 53. A spike-shaped voltage signal is thereby generated. This signal contains voltage values having opposite polarities and indicates positive and negative peak values of the excitation current. At the peak rectifier circuit, a control signal is then generated. This control signal corresponds to the amplitude of the above-mentioned spike-shaped voltage signal and is applied to the base of the transistor 57. As described later, the level of the econtrol signal decreases when the amplitude of the excitation current increases. The level of the control signal increases when the amplitude of the excitation current decreases.

If the amplitude of the excitation current increases due to an external perturbation such as variations in temperature, the base potential of the transistor 56 is raised, and the collector potential of the transistor 56 is reduced. The collector potential of the transistor 56 is applied to the base of the transistor 57 as a control signal. If the level of this control signal is reduced, the current flowing between the collector and the emitter of the transistor 57 decreases, and the collector potential of the transistor 57 increases. As a result, the collector-emitter potential of each of the transistors 21 and 31, that is, the operating voltage is reduced, and control is performed such that the amplitude of the excitation current decreases.

If the amplitude of the excitation current decreases due to an external perturbation, in contrast, the control signal level increases, and the operating voltage of the transistors 21 and 31 increases. Control is thus performed such that the amplitude of the excitation current increases.

As thus described, according to the embodiment, the amplitude of the excitation current is controlled, based on the result of detecting the amplitude of the excitation current, such that the amplitude of the excitation current is kept constant. Therefore, according to the embodiment, even if minor asymmetry of the wave of the excitation current between positive and negative portions exists, a change in the asymmetry due to external perturbations is prevented. Variations in the offset voltage is thereby made smaller.

In this embodiment, processing such as amplification or phase adjustment may be performed on the control signal, if necessary.

The remainder of configuration, operation and effects of the embodiment are similar to those of the first embodiment.

[Third Embodiment]

Figure 5:
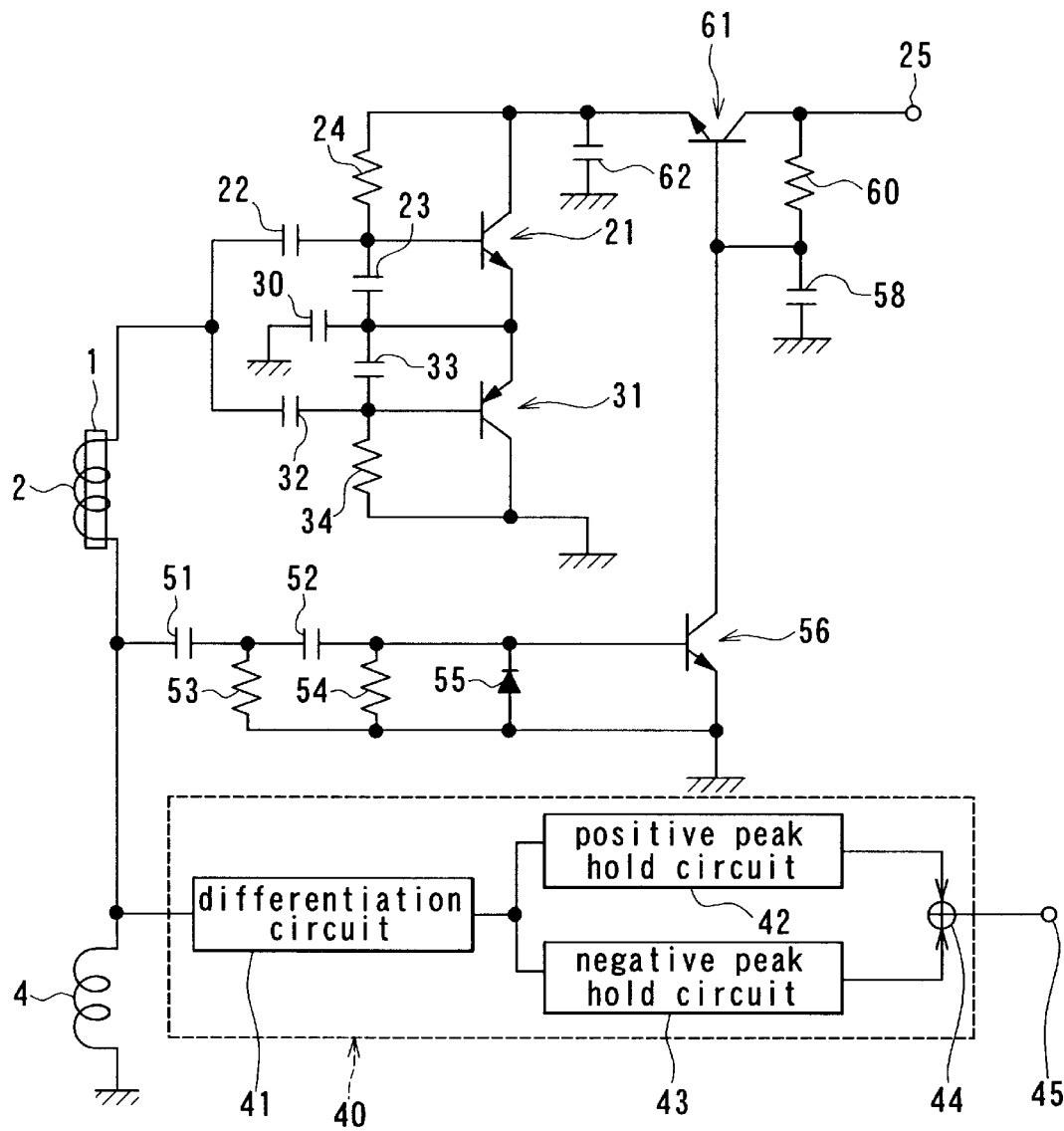
FIG. 5 is a circuit diagram illustrating the configuration of a magnetic sensor apparatus of a third embodiment of the invention.

Reference is now made to FIG. 5 to describe a magnetic sensor apparatus of a third embodiment of the invention. FIG. 5 is a circuit diagram illustrating the configuration of the magnetic sensor apparatus of the third embodiment.

As the apparatus of the second embodiment, the magnetic sensor apparatus of the third embodiment is similar to the magnetic sensor apparatus of the first embodiment to which the detection means and the control means are added. The detection means detects an alternating current flowing through the sensor coil 2. The control means controls the drive section based on the result of detection of the detection means and controls the amplitude of the current flowing through the sensor coil 2.

The differentiation circuit and the peak rectifier circuit of the third embodiment have the configurations similar to those of the second embodiment. In the third embodiment, an npn transistor 61 is provided in place of the transistor 57 of the second embodiment. The transistor 61 is located between the power input 25 and the collector of the transistor 21 of the first embodiment. The base of the transistor 61 is connected to the collector of the transistor 56. The collector of the transistor 61 is connected to the power input 25. The emitter of the transistor 61 is connected to the collector of the transistor 21, and grounded through a capacitor 62. The transistor 61 controls the operation voltage of the drive section in an equivalent manner, and corresponds to the control means of the invention. In the third embodiment the node between the collector of the transistor 31 and the resistor 34 is grounded.

In this embodiment, if the amplitude of the excitation current increases due to an external perturbation such as variations in temperature, the base potential of the transistor 56 is raised, and the collector potential of the transistor 56 is reduced. The collector potential of the transistor 56 is applied to the base of the transistor 61 as a control signal. If the level of this control signal is reduced, the emitter potential of the transistor 61 is reduced. Consequently, the collector-emitter potential of each of the transistors 21 and 31, that is, the operating voltage is reduced, and control is performed such that the amplitude of the excitation current decreases.

If the amplitude of the excitation current decreases due to an external perturbation, in contrast, the control signal level increases, and the operation voltage of the transistors 21 and 31 increases. Control is thus performed such that the amplitude of the excitation current increases.

In this embodiment, processing such as amplification or phase adjustment may be performed on the control signal, if necessary.

The remainder of configuration, operation and effects of the embodiment are similar to those of the first or second embodiment.

[Fourth Embodiment]

Figure 6:
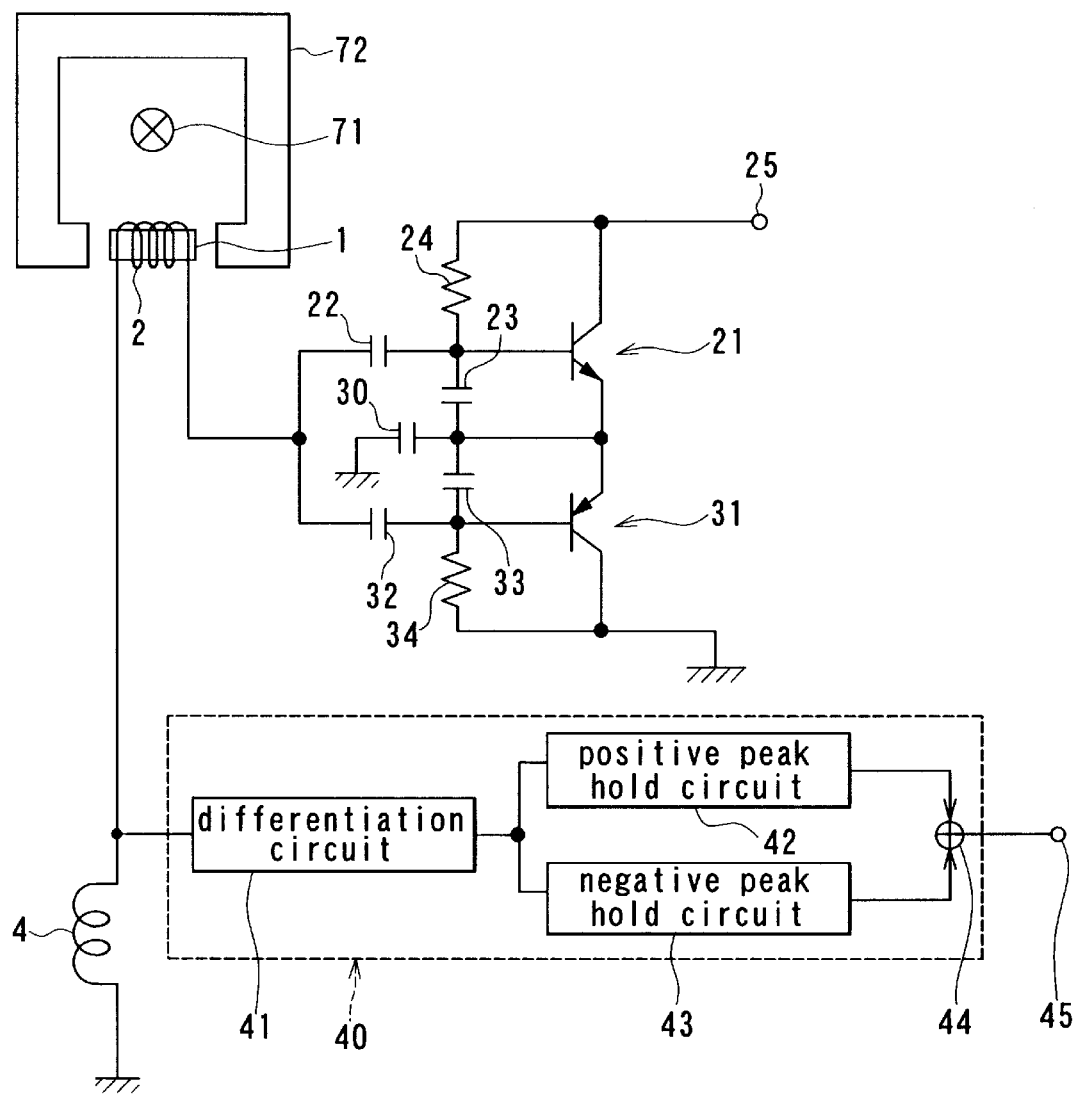
FIG. 6 is a circuit diagram illustrating the configuration of a current sensor apparatus of a fourth embodiment of the invention.

Reference is now made to FIG. 6 to describe a current sensor apparatus of a fourth embodiment of the invention. FIG. 6 is a circuit diagram illustrating the configuration of the current sensor apparatus of the fourth embodiment. The current sensor apparatus of the fourth embodiment incorporates the magnetic sensor apparatus of the first embodiment.

The current sensor apparatus of the fourth embodiment comprises a magnetic yoke 72 that surrounds a conductor 71 through which a current to be measured passes. Part of the yoke 72 has a gap. In the gap of the yoke 72, the core 1 and the sensor coil 2 of the magnetic sensor apparatus of the first embodiment are placed.

In the current sensor apparatus a magnetic flux is generated by a current (current to be measured) flowing through the conductor 71 in the direction orthogonal to the drawing sheet of FIG. 6. This flux is converged by the yoke 72 and passes through the yoke 72. The magnetic field in the above-mentioned gap (magnetic field to be measured) is then measured at the magnetic sensor apparatus including the core 1 and the sensor coil 2 placed in the gap of the yoke 72. Non-contact measurement of the current is thereby achieved.

The magnetic sensor apparatus utilized in this embodiment may be the apparatus of the second or third embodiment. The remainder of configuration, operation and effects of the embodiment are similar to those of the first to third embodiments.

[Fifth Embodiment]

Figure 7:
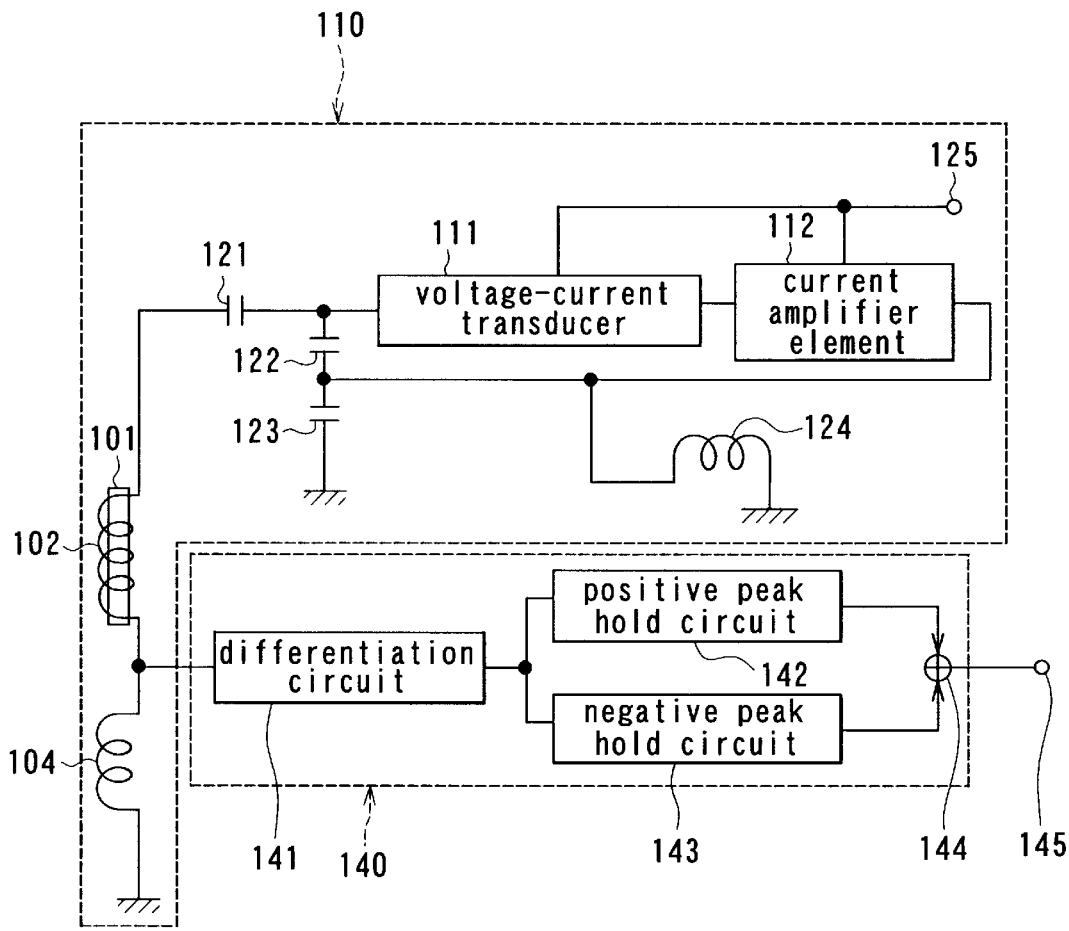
FIG. 7 is a block diagram illustrating the configuration of a magnetic sensor apparatus of a fifth embodiment of the invention.

FIG. 7 is a block diagram illustrating the configuration of a magnetic sensor apparatus of a fifth embodiment of the invention. The magnetic sensor apparatus comprises: a magnetic core 101 having a magnetic saturation property: a sensor coil 102 made up of at least one coil wound around the core 101; a drive section 110 for supplying an alternating current to the sensor coil 102 such that the core 101 is driven into a saturation region, and thereby driving the sensor coil 102; an inductance element 104 connected to the sensor coil 102 in series; and a detection section 140 for measuring a magnetic field. The sensor coil 102 is a coil for detecting an applied magnetic field to be measured. The inductance element 104 is an element for detecting variations in the inductance value of the sensor coil 102. The inductance element 104 may be a coil having an end connected to the other end of the sensor coil 102 and the other end grounded. The drive section 110 includes the sensor coil 102 and the inductance element 104. The detection section 140 is connected to the node between the sensor coil 102 and the inductance element 104.

The drive section 110 is a self-excited oscillation circuit having the following configuration. The drive section 110 includes a capacitor 121 for resonance, a feedback capacitor 122 and a feedback capacitor 123 that are connected to an end of the sensor coil 102 in series in this order. An end of the capacitor 123 opposite to the capacitor 122 is grounded. A series resonant circuit of the self-excited oscillation circuit is made up of the sensor coil 102, the inductance element 104 and the capacitors 121, 122 and 123. That is, part of the series resonant circuit is made up of the sensor coil 102.

The drive section 110 further includes a voltage-current transducer 111 and a current amplifier element 112 connected to the node between the capacitors 121 and 122 in a concatenation manner in this order. The current amplifier element 112 is connected to the node between the capacitors 122 and 123, and to a load inductance element 124 made of a coil, for example. The other end of the inductance element 124 is grounded. The voltage-current transducer 111 and the current amplifier element 112 are connected to a power input 125.

The voltage-current transducer 111 converts a voltage having a wave corresponding to the oscillation wave into a current and outputs the current. The current amplifier element 112 amplifies the current outputted from the transducer 111 and generates a current for continuing oscillation.

The detection section 140 comprises: a differentiation circuit 141 for differentiating the voltage generated across the inductance element 104, the circuit 141 being connected to the node between the sensor coil 102 and the inductance element 104; a positive peak hold circuit 142 for holding a positive peak value of an output signal of the differentiation circuit 141; a negative peak hold circuit 143 for holding a negative peak value of the output signal of the differentiation circuit 141; and an adding circuit 144 for adding the value held at the positive peak hold circuit 142 to the value held at the negative peak hold circuit 143. An output of the adding circuit 144 is connected to an output terminal 145.

Figure 8:
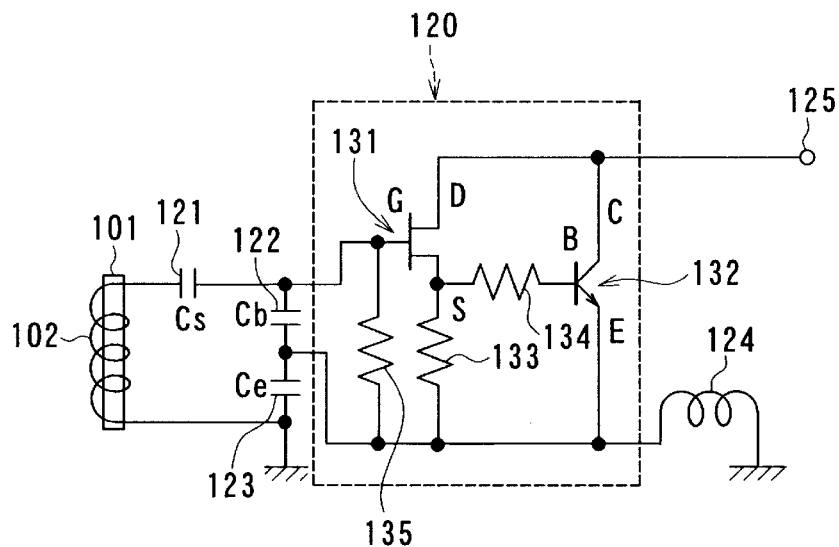
FIG. 8 is a circuit diagram illustrating an active element section of the self-excited oscillation circuit of the magnetic sensor apparatus of the fifth embodiment.

FIG. 8 is a circuit diagram illustrating an active element section of the self-excited oscillation circuit of the magnetic sensor apparatus of this embodiment. In the embodiment the active element section means the section including active elements and passive elements, such as resistors, that are required for the operation of these active elements. In FIG. 8 the active element section is indicated with numeral 120. The inductance element 104 is omitted in FIG. 8.

The active element section 120 includes: a junction field-effect transistor (junction FET) 131 as the voltage-current transducer 111; and an npn bipolar transistor 132 as the current amplifier element 112. The juntion FET 131 and the bipolar transistor 132 are connected to each other in a concatenation manner as described later.

Gate G of the junction FET 131 is connected to the node between the capacitors 121 and 122. Furthermore, gate G of the FET 131 is connected through a bias resistor 135 to the node between the capacitors 122 and 123, to emitter E of the bipolar transistor 132, and to one of the ends of the inductance element 124. Source S of the FET 131 is connected through a resistor 133 to the node between the capacitors 122 and 123, to emitter E of the bipolar transistor 132, and to the one of the ends of the inductance element 124. Furthermore, source S of the FET 131 is connected through a resistor 134 to base B of the bipolar transistor 132. Drain D of the FET 131 and collector C of the bipolar transistor 132 are connected to the power input 125.

The junction FET 131 has the property of reducing the oscillation amplitude as the operating temperature rises, and corresponds to a first active element of the invention. The bipolar transistor 132 has the property of increasing the oscillation amplitude as the operating temperature rises, and corresponds to a second active element of the invention.

Assuming that the capacitance values of the capacitors 121, 122 and 123 of FIG. 8 are Cs, Cb and Ce, respectively, the self-excited oscillation circuit shown in FIG. 8 is a Clapp oscillation circuit, wherein Cs<<Cb and Cs<<Ce. This self-excited oscillation circuit is a Colpitts oscillation circuit, wherein Cs>>Cb and Cs>>Ce.

Figure 9:
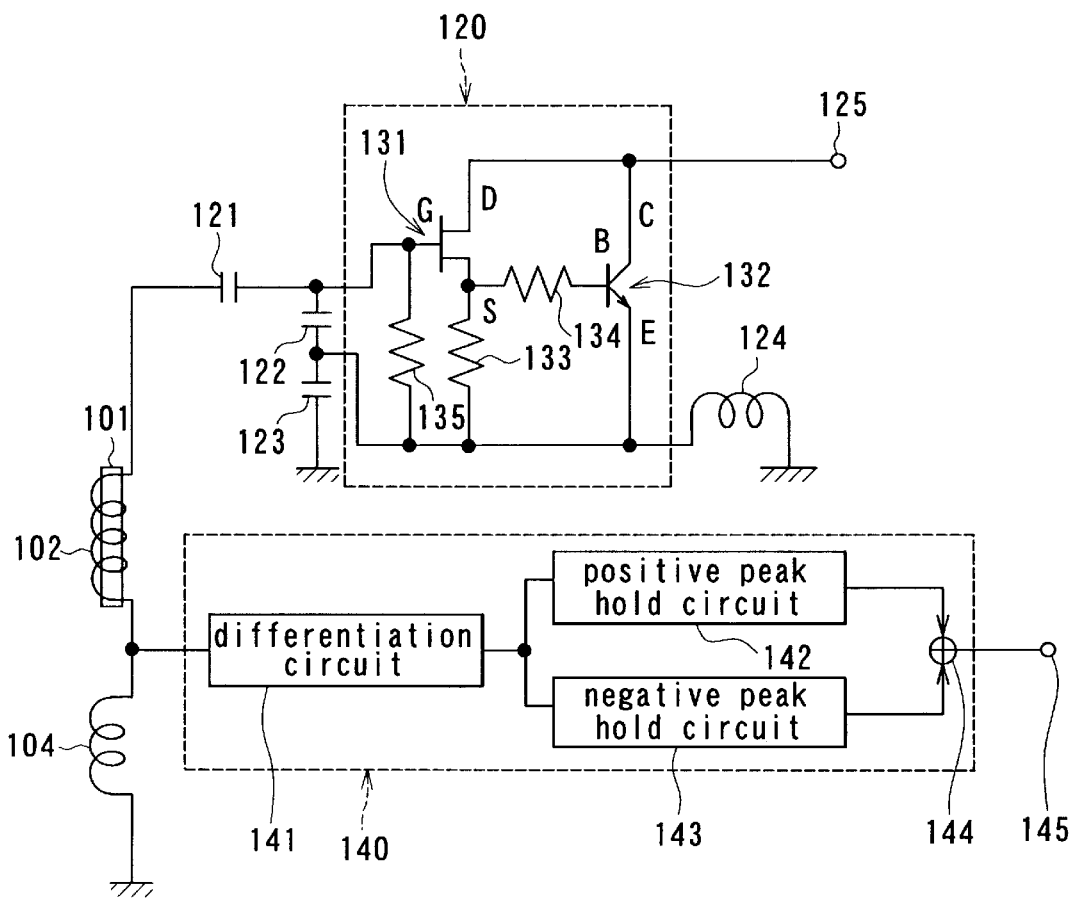
FIG. 9 is a circuit diagram illustrating the configuration of the magnetic sensor apparatus of the fifth embodiment.

FIG. 9 is a circuit diagram illustrating the configuration of the magnetic sensor apparatus of this embodiment including the active element section 120 shown in FIG. 8. A description of FIG. 9 is omitted since it overlaps the descriptions of FIG. 7 and FIG. 8.

The operation of the magnetic sensor apparatus of this embodiment will now be described. In the magnetic sensor apparatus, the drive section 110 made up of the self-excited oscillation circuit supplies an alternating excitation current to the sensor coil 102. This excitation current is such a current that the core 101 is driven into a saturation region. The sensor coil 102 is thereby driven. This excitation current is equal to the current value limited by the supply voltage multiplied by value Q of the series resonant circuit of the self-excited oscillation circuit.

When the core 101 is driven into the saturation region in a neighborhood of a peak value of the excitation current, the inductance value of the sensor coil 102 abruptly decreases, so that the excitation current abruptly increases. If the wave of the excitation current is differentiated twice, it is possible to detect an output of an opposite phase that is geometrically similar to the wave of the current that has abruptly increased. In this embodiment the excitation current of the sensor coil 102 is differentiated twice at the inductance element 104 and the differentiation circuit 141, and made into a spike-shaped voltage signal that contains voltage values having opposite polarities and indicates positive and negative peak values of the excitation current. Each of these peak values of the positive and negative spike-shaped voltage values of this signal is held at the positive peak hold circuit 142 and the negative peak hold circuit 143, respectively, and added to each other at the adding circuit 144. The result is then outputted from the terminal 145 as an output signal corresponding to the magnetic field to be measured.

In this embodiment the active element section 120 of the self-excited oscillation circuit includes: the junction FET 131 as the voltage-current transducer 111; and the bipolar transistor 132 as the current amplifier element 112.

The input impedance of gate G of the FET 131 is extremely high, so that clamping of the input signal will not occur. Therefore, when the junction FET 131 that is a voltage-driven element is utilized as the voltage-current transducer 111, no current is required for driving the transducer 111, and there is no portion for diverting the energy. As a result, no clamping occurs in the voltage wave (oscillation wave) applied to the input terminal of the transducer 111 (that is, gate G of the FET 131). The current outputted from the transducer 111 is amplified at the current amplifier element 112 and charged in the capacitor 123. The energy generated by this charging is used for continuing oscillation.

Since no clamping of the oscillation wave occurs in this embodiment, asymmetry of the oscillation wave between positive and negative portions is very small. Since no clamping itself occurs, it is impossible that variations occur in asymmetry due to variations in the clamping potential with temperature changes. Therefore, according to the embodiment, the offset voltage of the magnetic sensor apparatus incorporating the fluxgate element is reduced.

The current output of the active element section 120 is obtained from emitter E of the bipolar transistor 132 as the current amplifier element 112. In this embodiment the bipolar transistor 132 is adoptable as the amplifier element 112. Since the transistor 132 has a sufficiently small collector-emitter saturation voltage, power loss is reduced.

The voltage-current transducer 111 could be a circuit such as a voltage follower made up of an operational amplifier, an emitter follower of a bipolar transistor, or a source follower of a junction or MOS FET. However, an operational amplifier is wasteful in terms of cost. The emitter follower of the bipolar transistor has such a property that clamping occurs if the base voltage increases and the transistor is saturated, and the oscillation amplitude increases as the operating temperature rises. Therefore, if a bipolar transistor is used as the current amplifier element 112, both the transducer 111 and the amplifier element 112 increase the oscillation amplitude as the operating temperature rises, which is not preferred.

On the other hand, it is possible to utilize a FET for a low-level signal since it is acceptable that the output current of the voltage-current transducer is high enough to drive the amplifier element 112. As thus described, it is preferred that the voltage-current transducer used in the invention is a FET.

Furthermore, the temperature coefficient of the mutual conductance between the gate voltage and the drain current is negative with regard to a junction FET or a MOS FET. This means that the conversion factor of voltage-current conversion decreases as the operating temperature rises if the transducer 111 is a FET. Therefore, the FET 131 as the transducer 111 of this embodiment has the property of reducing the oscillation amplitude as the operating temperature rises.

In contrast, the temperature coefficient of the current amplification factor is positive with regard to a bipolar transistor. Therefore, the bipolar transistor 132 as the current amplifier element 112 of this embodiment has the property of increasing the oscillation amplitude as the operating temperature rises.

In this embodiment, as thus described, the self-excited oscillation circuit includes the FET 131 and the bipolar transistor 132, the FET 131 having the property of reducing the oscillation amplitude as the operating temperature rises, the bipolar transistor 132 having the property of increasing the oscillation amplitude as the operating temperature rises. Therefore, in the self-excited oscillation circuit, the FET 131 and the bipolar transistor 132 produce variations in the oscillation amplitude in opposite directions in response to an increase in temperature. As a result, according to the embodiment, it is possible to effectively suppress variations in the oscillation amplitude of the drive section 110 (self-excited oscillation circuit) in response to temperature changes. It is thereby possible to reduce variations in the offset voltage of the magnetic sensor apparatus incorporating the fluxgate element.

This means that variations in the offset voltage due to variations in the oscillation amplitude are suppressed even if there remains asymmetry of the oscillation wave between positive and negative portions caused by an unidentified factor other than clamping, which is very favorable to practical applications.

According to the embodiment thus described, there is almost no asymmetry of the oscillation wave between positive and negative portions resulting from clamping, so that there is almost no asymmetrical variation in temperature in response to clamping. In addition, the dependence of the oscillation amplitude on a temperature is suppressed, so that it is impossible that remaining minor asymmetry is expanded due to temperature changes. Therefore, the embodiment achieves any of the following objects for solving the problems caused by the offset voltage of the magnetic sensor apparatus incorporating the fluxgate element.

(1) To minimize asymmetry of the oscillation wave between positive and negative portions.

(2) To prevent variations in asymmetry of the oscillation wave between positive and negative portions, due to the operating temperature of an active element of the oscillation circuit.

(3) To prevent variations in oscillation amplitude, due to the operating temperature of an active element of the oscillation circuit.

Figure 14:
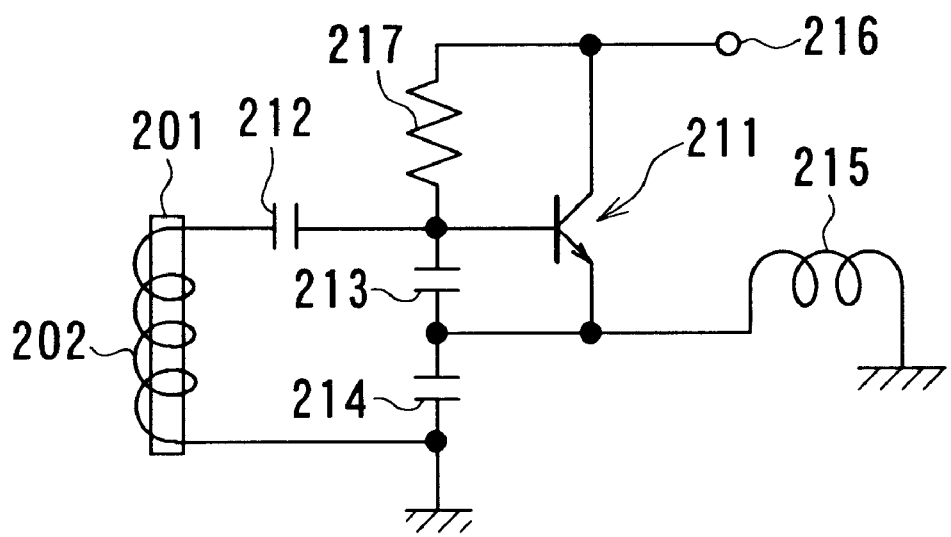
FIG. 14 is a circuit diagram illustrating an example of the configuration of a Clapp oscillation circuit for exciting the sensor coil of FIG. 13.
Figure 15:
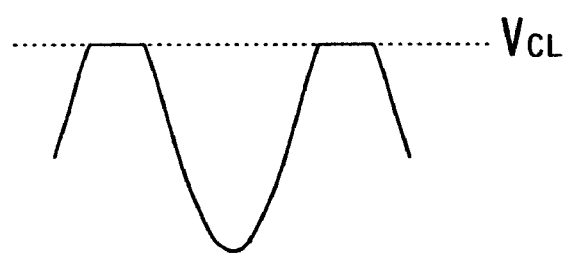
FIG. 15 is a plot for illustrating the oscillation wave observed at the base of the transistor of FIG. 14.

The self-excited oscillation circuit of the embodiment may be implemented with a very simple configuration, such as the prior-art self-excited oscillation circuit as shown in FIG. 14, for example, to which the FET 131 for a low-level signal and the two resistors 133 and 134 for source loads are added. As a result, the embodiment achieves the magnetic sensor apparatus that is very inexpensive and has excellent properties. This magnetic sensor apparatus will make a great contribution to the industry if it is applied to a current sensor apparatus, for example, used in applications such as an electric car or solar-electric power generation.

[Sixth Embodiment]

Figure 10:
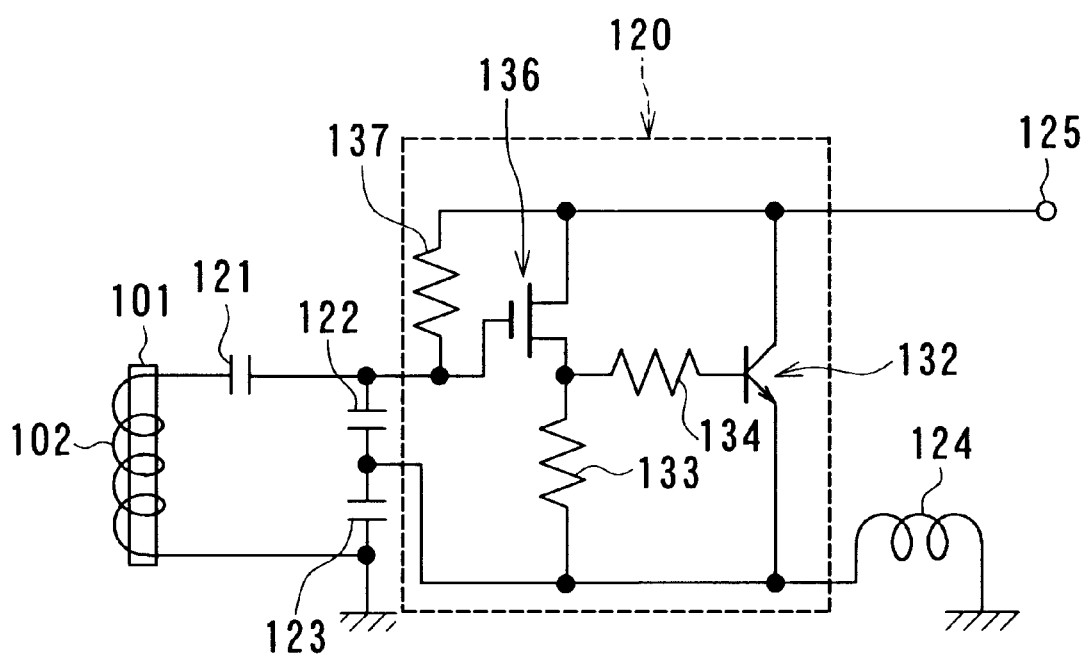
FIG. 10 is a circuit diagram illustrating an active element section of a self-excited oscillation circuit of a magnetic sensor apparatus of a sixth embodiment of the invention.

Reference is now made to FIG. 10 to describe a magnetic sensor apparatus of a sixth embodiment of the invention. FIG. 10 is a circuit diagram illustrating the active element section of the self-excited oscillation circuit of the magnetic sensor apparatus of this embodiment. AMOS FET 136 for a low-level signal is utilized as the voltage-current transducer 111 of the self-excited oscillation circuit of this embodiment, in place of the junction FET 131 of the fifth embodiment. A bias resistor 137 is provided between the gate of the FET 136 and the power input 125 in the sixth embodiment, in place of the bias resistor 135 of the fifth embodiment.

The remainder of configuration, operation and effects of the embodiment are similar to those of the fifth embodiment.

[Seventh Embodiment]

Figure 11:
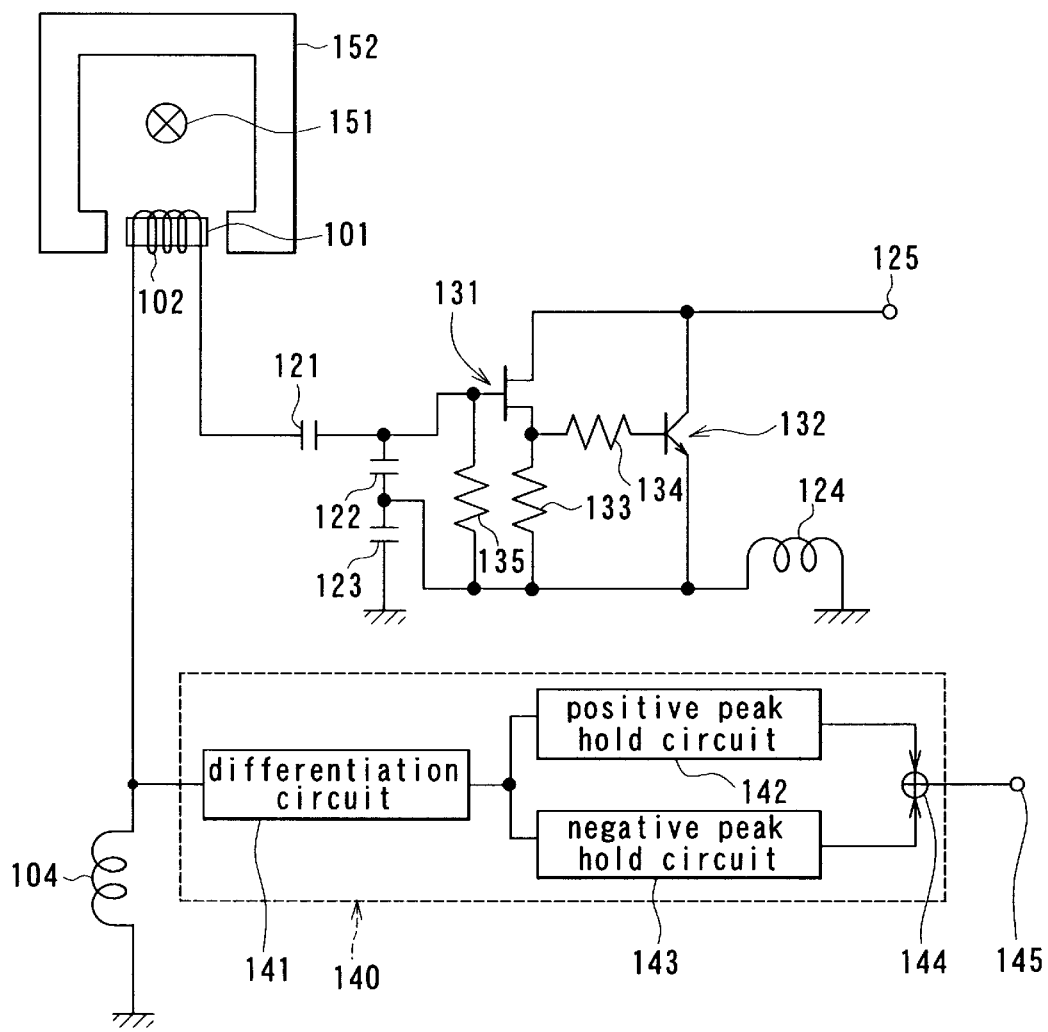
FIG. 11 is a circuit diagram illustrating the configuration of a current sensor apparatus of a seventh embodiment of the invention.
Figure 12:
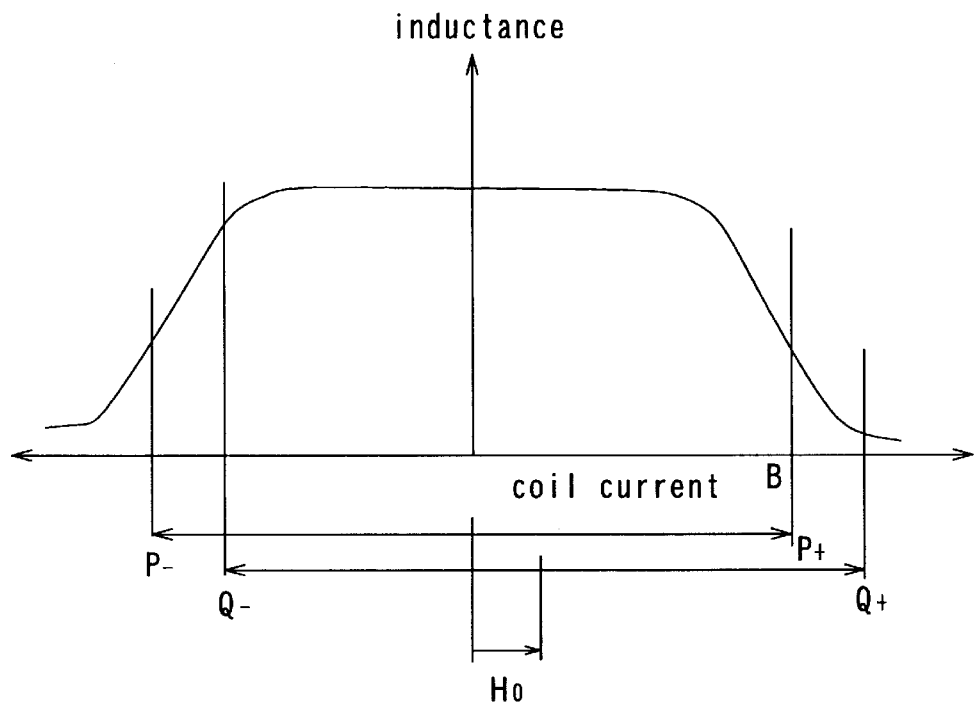
FIG. 12 is an explanatory view for describing the operation principle of a fluxgate element.
Figure 13:
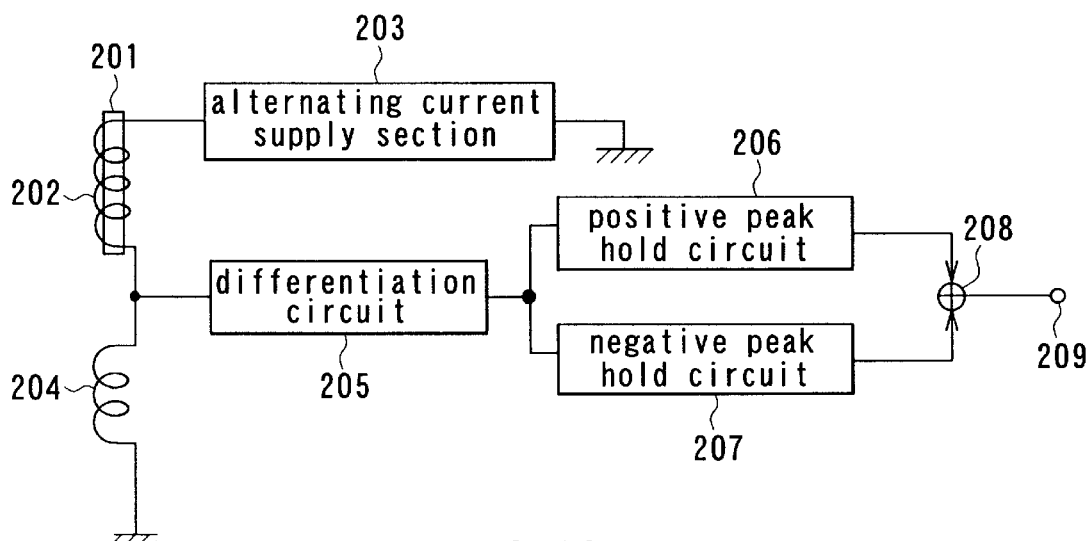
FIG. 13 is a block diagram illustrating an example of the configuration of a magnetic sensor apparatus incorporating a fluxgate element.

Reference is now made to FIG. 11 to describe a current sensor apparatus of a seventh embodiment of the invention. FIG. 11 is a circuit diagram illustrating the configuration of the current sensor apparatus of the seventh embodiment. The current sensor apparatus of the seventh embodiment incorporates the magnetic sensor apparatus of the fifth embodiment.

The current sensor apparatus of the seventh embodiment comprises a magnetic yoke 152 that surrounds a conductor 151 through which a current to be measured passes. Part of the yoke 152 has a gap. In the gap of the yoke 152, the core 101 and the sensor coil 102 of the magnetic sensor apparatus of the fifth embodiment are placed.

In the current sensor apparatus a magnetic flux is generated by a current (current to be measured) flowing through the conductor 151 in the direction orthogonal to the drawing sheet of FIG. 11. This flux is converged by the yoke 152 and passes through the yoke 152. The magnetic field in the above-mentioned gap (magnetic field to be measured) is then measured at the magnetic sensor apparatus including the core 101 and the sensor coil 102 placed in the gap of the yoke 152. Non-contact measurement of the current is thereby achieved.

The magnetic sensor apparatus utilized in this embodiment may be the apparatus of the sixth embodiment. The remainder of configuration, operation and effects of the embodiment are similar to those of the fifth or sixth embodiment.

The present invention is not limited to the foregoing embodiments but may be practiced in still other ways. For example, the circuit configurations described in the foregoing embodiment are given as examples and may be practiced in still other ways through the use of known techniques.

According to the magnetic sensor apparatus or the current sensor apparatus of the invention as thus described, each of the two active elements individually causes variations in the oscillation wave in response to changes in operating temperature. The variations in the oscillation wave caused by the two active elements work in directions that suppress variations in asymmetry of the oscillation wave between positive and negative portions of the wave. As a result, it is possible to reduce the offset voltage of the magnetic sensor apparatus or the current sensor apparatus incorporating the fluxgate element.

According to the magnetic sensor apparatus or the current sensor apparatus of the invention, the two active elements may be: the npn transistor that operates when the oscillation wave is on the positive side; and the pnp transistor that operates when the oscillation wave is on the negative side. In this case, clamping of the oscillation wave similarly occurs on the positive and negative sides. As a result, the asymmetry of the oscillation wave between positive and negative portions is reduced. It is thereby possible to reduce the offset voltage and to reduce variations in the offset voltage of the magnetic sensor apparatus or the current sensor apparatus incorporating the fluxgate element.

According to the magnetic sensor apparatus or the current sensor apparatus of the invention, the emitter of the npn transistor may be connected to the emitter of the pnp transistor. In this case, one of the transistors functions as the load of the emitter of the other of the transistors. It is not necessary to provide individual loads for the emitters of the transistors.

According to the magnetic sensor apparatus or the current sensor apparatus of the invention, the npn transistor and the pnp transistor may be formed on one semiconductor substrate. It is thus possible to more greatly reduce variations in the offset voltage with respect to temperature changes.

According to the magnetic sensor apparatus or the current sensor apparatus of the invention, the amplitude of the current flowing through the sensor coil may be controlled. In this case, it is possible to make variations in the offset voltage smaller.

According to the magnetic sensor apparatus or the current sensor apparatus of the invention, the two active elements may be: the first active element having the property of decreasing an oscillation amplitude as the operating temperature rises; and the second active element having the property of increasing the oscillation amplitude as the operating temperature rises. In this case, variations in the offset voltage in response to temperature changes are suppressed. It is thereby possible to reduce variations in the offset voltage of the magnetic sensor apparatus or the current sensor apparatus incorporating the fluxgate element.

According to the magnetic sensor apparatus or the current sensor apparatus of the invention, the self-excited oscillation circuit may include: the voltage-current transducer incorporating the field-effect transistor and converting a voltage having a wave corresponding to the oscillation wave into a current and outputting the current; and the current amplifier element incorporating the bipolar transistor and amplifying the current outputted from the transducer and generating a current used for continuing oscillation. In this case, no clamping occurs. Therefore, the asymmetry of the oscillation wave between positive and negative portions is suppressed, and the offset voltage is reduced.

Obviously many modifications and variations of the present invention are possible in the light of the above teachings. It is therefore to be understood that within the scope of the appended claims the invention may be practiced otherwise than as specifically described.

What is claimed is:

1. A magnetic sensor apparatus comprising:
   a magnetic core;
   a sensor coil wound around the core and provided for detecting an applied magnetic field to be measured;
   a drive means for driving the sensor coil by supplying an alternating current to the sensor coil, the alternating current driving the core into a saturation region, wherein the drive means incorporates a self-excited oscillation circuit including a resonant circuit part of which is made up of the sensor coil; and
   the self-excited oscillation circuit includes two active elements, used for continuing oscillation, each of which individually causes variations in an oscillation wave in response to changes in operating temperature, and the variations in the oscillation wave caused by the two active elements work together to suppress variations in asymmetry of the oscillation wave between positive and negative portions of the wave.

2. The magnetic sensor apparatus according to claim 1 wherein the two active elements are: an npn transistor that operates when the oscillation wave is on the positive side; and a pnp transistor that operates when the oscillation wave is on the negative side; the npn and pnp transistors being amplifier elements used for continuing oscillation.

3. The magnetic sensor apparatus according to claim 2 wherein an emitter of the npn transistor is connected to an emitter of the pnp transistor.

4. The magnetic sensor apparatus according to claim 2, further comprising: a detection means for detecting the alternating current flowing through the sensor coil; and a control means for controlling the drive means based on a result of detection of the detection means and controlling an amplitude of the current flowing through the sensor coil.

5. The magnetic sensor apparatus according to claim 4, wherein the control means controls an operating voltage of the drive means.

6. The magnetic sensor apparatus according to claim 1 wherein the two active elements are: a first active element having a property of decreasing an oscillation amplitude as the operating temperature rises; and a second active element having a property of increasing the oscillation amplitude as the operating temperature rises.

7. The magnetic sensor apparatus according to claim 6 wherein the first active element is a field-effect transistor and the second active element is a bipolar transistor.

8. The magnetic sensor apparatus according to claim 7, wherein the bipolar transistor is cascaded to the field-effect transistor.

9. The magnetic sensor apparatus according to claim 8, wherein the self-excited oscillation circuit includes, a voltage-current transducer incorporating the field-effect transistor and converting a voltage having a wave corresponding to the oscillation wave into a current and outputting the current, and a current amplifier element incorporating the bipolar transistor and amplifying the current outputted from the voltage-current transducer and generating a current used for continuing oscillation.

10. The magnetic sensor apparatus according to claim 1 wherein the self-excited oscillation circuit is a Colpitts oscillation circuit or a Clapp oscillation circuit.

11. A current sensor apparatus for measuring an electric current by measuring a magnetic field generated by the current to be measured, the apparatus comprising:
    a magnetic core;
    a sensor coil wound around the core and provided for detecting an applied magnetic field to be measured;
    a drive means for driving the sensor coil by supplying an alternating current to the sensor coil, the alternating current driving the core into a saturation region, wherein the drive means incorporates a self-excited oscillation circuit including a resonant circuit part of which is made up of the sensor coil; and
    the self-excited oscillation circuit includes two active elements, used for continuing oscillation, each of which individually causes variations in an oscillation wave in response to changes in operating temperature, and the variations in the oscillation wave caused by the two active elements work together to suppress variations in asymmetry of the oscillation wave between positive and negative portions of the wave.

12. The current sensor apparatus according to claim 11 wherein the two active elements are: an npn transistor that operates when the oscillation wave is on the positive side; and a pnp transistor that operates when the oscillation wave is on the negative side; the npn and pnp transistors being amplifier elements used for continuing oscillation.

13. The current sensor apparatus according to claim 12 wherein an emitter of the npn transistor is connected to an emitter of the pnp transistor.

14. The current sensor apparatus according to claim 12 further comprising: a detection means for detecting the alternating current flowing through the sensor coil; and a control means for controlling the drive means based on a result of detection of the detection means and controlling an amplitude of the current flowing through the sensor coil.

15. The current sensor apparatus according to claim 14, wherein the control means controls an operating voltage of the drive means.

16. The current sensor apparatus according to claim 11 wherein the two active elements are: a first active element having a property of decreasing an oscillation amplitude as the operating temperature rises; and a second active element having a property of increasing the oscillation amplitude as the operating temperature rises.

17. The current sensor apparatus according to claim 16 wherein the first active element is a field-effect transistor and the second active element is a bipolar transistor.

18. The current sensor apparatus according to claim 17, wherein the bipolar transistor is cascaded to the field-effect transistor.

19. The current sensor apparatus according to claim 18, wherein the self-excited oscillation circuit includes a voltage-current transducer incorporating the field-effect transistor and converting a voltage having a wave corresponding to the oscillation wave into a current and outputting the current, and a current amplifier element incorporating the bipolar transistor and amplifying the current outputted from the voltage current transducer and generating a current used for continuing oscillation.

20. The current sensor apparatus according to claim 11 wherein the self-excited oscillation circuit is a Colpitts oscillation circuit or a Clapp oscillation circuit.

* * * * *